(12) United States Patent
Minemura

(10) Patent No.: US 11,177,152 B2
(45) Date of Patent: Nov. 16, 2021

(54) CERAMIC SUBSTRATE CONTAINING ALUMINUM OXIDE AND ELECTROSTATIC CHUCK HAVING ELECTRODE CONTAINING TUNGSTEN WITH OXIDES

(71) Applicant: SHINKO ELECTRIC INDUSTRIES CO., LTD., Nagano (JP)

(72) Inventor: Tomotake Minemura, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 270 days.

(21) Appl. No.: 16/555,011

(22) Filed: Aug. 29, 2019

(65) Prior Publication Data

US 2020/0075383 A1 Mar. 5, 2020

(30) Foreign Application Priority Data

Sep. 5, 2018 (JP) .............................. JP2018-165830
Aug. 9, 2019 (JP) .............................. JP2019-147509

(51) Int. Cl.
| | | |
|---|---|---|
| *H01L 21/683* | (2006.01) | |
| *C04B 37/02* | (2006.01) | |
| *H01L 21/67* | (2006.01) | |
| *C04B 41/90* | (2006.01) | |
| *C04B 35/00* | (2006.01) | |

(52) U.S. Cl.
CPC .......... *H01L 21/6833* (2013.01); *C04B 35/00* (2013.01); *C04B 37/02* (2013.01); *C04B 41/90* (2013.01); *H01L 21/67103* (2013.01); *H01L 21/6835* (2013.01)

(58) Field of Classification Search
CPC ........... H01L 21/6833; H01L 21/67103; H01L 21/6835; H01L 21/68785; H01L 21/68757; H01L 21/6831; H01L 21/4807; C04B 37/02; C04B 41/90; C04B 35/00; C04B 41/5133; C04B 41/88; C04B 41/009

See application file for complete search history.

(56) References Cited

U.S. PATENT DOCUMENTS

| | | | | |
|---|---|---|---|---|
| 4,015,230 A | * | 3/1977 | Nitta .................... | G01N 27/121 338/35 |
| 2017/0148657 A1 | * | 5/2017 | Pape ................... | H01L 21/6833 |
| 2020/0231505 A1 | * | 7/2020 | Horiuchi ................. | B32B 18/00 |

FOREIGN PATENT DOCUMENTS

| | | |
|---|---|---|
| JP | H04-331779 | 11/1992 |
| JP | H06-290635 | 10/1994 |

* cited by examiner

*Primary Examiner* — John P. Dulka
(74) *Attorney, Agent, or Firm* — Rankin, Hill & Clark LLP

(57) ABSTRACT

A ceramics substrate includes: a substrate body; and an electric conductor patient that is provided in the substrate body. The substrate body is made of ceramics containing aluminum oxide. The electric conductor pattern is a sintered body that contains tungsten as a main component and further contains nickel oxide, aluminum oxide and silicon dioxide.

10 Claims, 12 Drawing Sheets

FIG.8

| No. | ADDITIVE AMOUNT wt% | | | RESISTIVITY Ωm | SINTERABILITY | ADHESIVENESS |
| --- | --- | --- | --- | --- | --- | --- |
| | NiO | $Al_2O_3$ | $SiO_2$ | | | |
| 1 | - | - | - | 2.85E-07 | POOR | — |
| 2 | 0.1 | 0.1 | 0.1 | 2.85E-07 | POOR | — |
| 3 | 0.2 | 0.2 | 0.2 | 3.14E-07 | EXCELLENT | EXCELLENT |
| 4 | 0.5 | 0.5 | 0.5 | 2.06E-07 | EXCELLENT | EXCELLENT |
| 5 | 1 | 1 | 1 | 1.32E-07 | EXCELLENT | EXCELLENT |
| 6 | 1 | 2 | 2 | 2.34E-07 | EXCELLENT | EXCELLENT |
| 7 | 1 | 3 | 3 | 2.84E-07 | EXCELLENT | EXCELLENT |
| 8 | 1 | 0.1 | 1 | 1.34E-07 | EXCELLENT | EXCELLENT |
| 9 | 1 | 0.2 | 1 | 1.16E-07 | EXCELLENT | EXCELLENT |
| 10 | 1 | 0.5 | 1 | 1.33E-07 | EXCELLENT | EXCELLENT |
| 11 | 1 | 2 | 1 | 2.31E-07 | EXCELLENT | EXCELLENT |
| 12 | 1 | 3 | 1 | 2.65E-07 | EXCELLENT | EXCELLENT |
| 13 | 0.1 | 1 | 1 | 3.65E-07 | POOR | — |
| 14 | 0.2 | 1 | 1 | 1.70E-07 | EXCELLENT | EXCELLENT |
| 15 | 0.5 | 1 | 1 | 1.86E-07 | EXCELLENT | EXCELLENT |
| 16 | 1 | 1 | 0.1 | 1.80E-07 | EXCELLENT | EXCELLENT |
| 17 | 1 | 1 | 0.2 | 1.47E-07 | EXCELLENT | EXCELLENT |
| 18 | 1 | 1 | 0.5 | 1.77E-07 | EXCELLENT | EXCELLENT |
| 19 | 1 | 1 | 2 | 1.57E-07 | EXCELLENT | EXCELLENT |
| 20 | 1 | 1 | 3 | 2.56E-07 | EXCELLENT | EXCELLENT |

CERAMIC SUBSTRATE CONTAINING ALUMINUM OXIDE AND ELECTROSTATIC CHUCK HAVING ELECTRODE CONTAINING TUNGSTEN WITH OXIDES

This application claims priority from Japanese Patent Applications No. 2018-165830, filed on Sep. 5, 2018 and No. 2019-147509, filed on Aug. 9, 2019, the entire contents of which are herein incorporated by reference.

BACKGROUND

1. Technical Field

The present disclosure relates to a ceramics substrate and an electrostatic chuck.

2. Background Art

In the background art, a semiconductor manufacturing apparatus for treating a substrate such as a semiconductor wafer has an electrostatic chuck for retaining the semiconductor wafer. The semiconductor manufacturing apparatus is, for example, a film forming apparatus such as a CVD apparatus or a PVD apparatus, a plasma etching apparatus, etc. The electrostatic chuck has a mounting table of a ceramics substrate, and a conductor pattern disposed internally in the mounting table. With this configuration, the electrostatic chuck can retain a substrate on the mounting table with the conductor pattern as an electrostatic electrode. For example, the conductor pattern is formed in such a manner that an electrically conductive paste containing a high melting point material such as tungsten is used and fired simultaneously with the ceramics substrate (e.g. see PTL 1 and PTL 2). Incidentally, the ceramics substrate for a semiconductor device is also formed in a similar manner or the same manner (see e.g., JP-A-H4-331779 and JP-A-H6-290635).

The aforementioned electrostatic chuck is formed in such a manner that an electrically conductive paste is printed on a green sheet, and the green sheet and the electrically conductive paste are sintered simultaneously. For example, assume that the green sheet is made of ceramics (alumina ceramics) containing aluminum oxide (alumina) as a main component, and the electrically conductive paste is made of tungsten. In this case, a sintering agent (e.g. silica, magnesia, calcia, yttria, etc.) is generally often contained in the alumina ceramics. The ceramics containing the sintering agent in this manner has a value of insulation resistance which is apt to decrease as temperature of a usage environment increases. Therefore, it is desirable to use sintering agent-free alumina ceramics with low temperature dependency of insulation resistance. However, since there is no sintering agent which can turn to a liquid phase during firing, it may be impossible to obtain bonding strength between the ceramics and the tungsten which serves as a conductor.

SUMMARY

Certain embodiments provide a ceramics substrate.
The ceramics substrate comprises:
a substrate body; and
an electric conductor pattern that is provided in the substrate body.
The substrate body is made of ceramics containing aluminum oxide.

The electric conductor pattern is a sintered body that contains tungsten as a main component and further contains nickel oxide, aluminum oxide and silicon dioxide.

BRIEF DESCRIPTION OF DRAWINGS

FIG. 8 is an explanatory view showing an additive amount, resistivity, and evaluation results of sinterability and adhesiveness of each of samples.

DESCRIPTION OF EMBODIMENTS

Embodiments will be described below.
Incidentally, some accompanying drawings show constituent elements in an enlarged manner in order to make it easy to understand the constituent elements. Constituent elements in some drawings have different dimension ratios from real ones or ones in another drawing or other drawings. In addition, in sectional views, some constituent elements to be hatched are not hatched, in order to make it easy to understand the constituent elements.

First Embodiment

Figure 1:
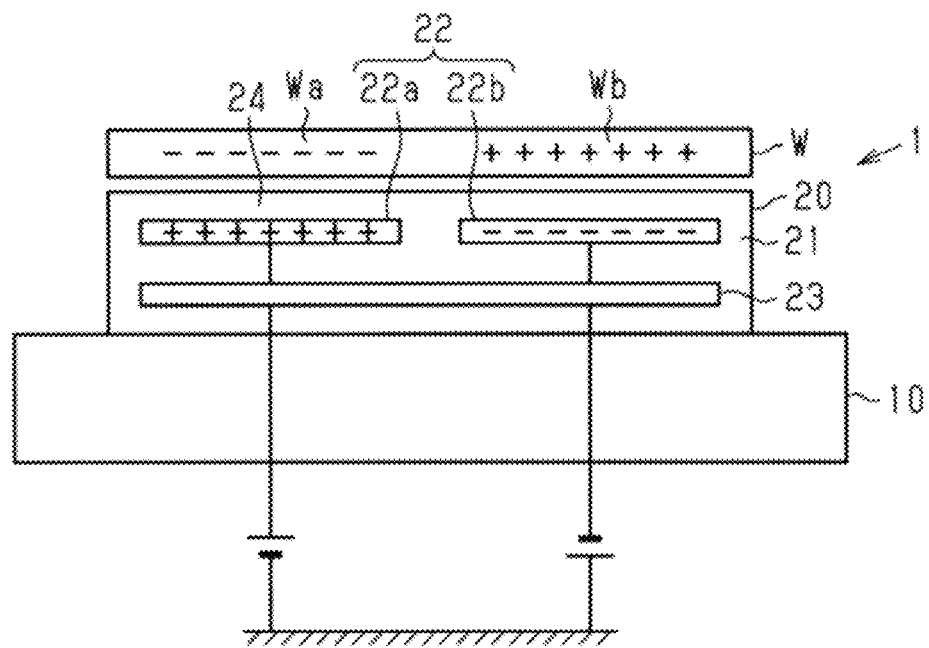
FIG. 1 is a schematic sectional view of an electrostatic chuck according to a first embodiment.

FIG. 1 shows a schematic section of an electrostatic chuck according to a first embodiment. As shown in FIG. 1, the electrostatic chuck 1 has a base plate 10, and a mounting table 20 disposed on the base plate 10. The mounting table 20 is fixed to an upper surface of the base plate 10, for example, by an adhesive agent of a silicone resin etc. Incidentally, the mounting table 20 may be fixed to the base plate 10 by screws.

The material of the base plate 10 is, for example, a metal material such as aluminum or a cemented carbide alloy, or a composite material containing the metal material and a ceramics material. For example, a material formed in such a manner that aluminum or an alloy thereof is used and a surface thereof is subjected to alumite treatment (for forming an insulating layer) is used in terms of availability, machining easiness, excellent thermal conductivity, etc. For example, a feeding path of a refrigerant (gas, cooling water, etc.) for cooling a substrate W mounted on an upper surface of the mounting table 20 may be also provided in the base plate 10. The substrate W is, for example, a semiconductor wafer.

The mounting table 20 has a substrate body 21, and an electrostatic electrode 22 and a heating element 23 which are provided internally in the substrate body 21.

The substrate body 21 is formed into a disk shape in accordance with the shape of the substrate W. The substrate body 21 is made of ceramics containing aluminum oxide ($Al_2O_3$). The "ceramics containing aluminum oxide" means ceramics free from addition of any other inorganic component than the aluminum oxide. The aluminum oxide for the substrate body 21 made of the ceramics preferably has a purity of 99.5% or more. The purity of 99.5% or more means that the substrate body 21 is formed without adding any sintering agent. In addition, the purity of 99.5% or more also means that the substrate body 21 may contain unintended impurities in a manufacturing process etc. The substrate body 21 preferably has a relative density of 98% or more. Specifically, the relative density of the substrate body 21 to ceramics containing only the aluminum oxide is preferably 98% or more. An average grain size of the aluminum oxide for the substrate body 21 is preferably not smaller than 1.0 μm and not larger than 3.0 μm.

As a method for manufacturing the mounting table 20, each of a metal material for the electrostatic electrode 22 and an electric heating material for the heating element 23 is interposed between green sheets, and a resulting layered body thereof is sintered. Thus, the mounting table 20 where the electrostatic electrode 22 and the heating element 23 are provided in the substrate body 21 can be obtained.

The electrostatic electrode 22 is an electric conductor formed like a film. The electrostatic electrode 22 according to the present embodiment is of a bipolar type and has a first electrostatic electrode 22a and a second electrostatic electrode 22b. Incidentally, a unipolar type electrostatic electrode consisting of one electrostatic electrode may be used as the electrostatic electrode 22. An electrically conductive paste which contains tungsten (W) as a main component and is added with nickel oxide (NiO), aluminum oxide and silicon dioxide ($SiO_2$) can be used as the material of the electrostatic electrode 22.

The beating element 23 is disposed under the first electrostatic electrode 22a and the second electrostatic electrode 22b. The beating element 23 is an electric conductor formed like a film. The heating element 23 is provided as a plurality of heater electrodes which can make heating control on a plurality of planar regions (beater zones) of the substrate body 21 independently, incidentally, the heating element 23 may be provided as one heater electrode. An electrically conductive paste which contains tungsten (W) as a main component and is added with nickel oxide (NiO), aluminum oxide and silicon dioxide ($SiO_2$) can be used as the material of the heating element 23.

Figure 2:
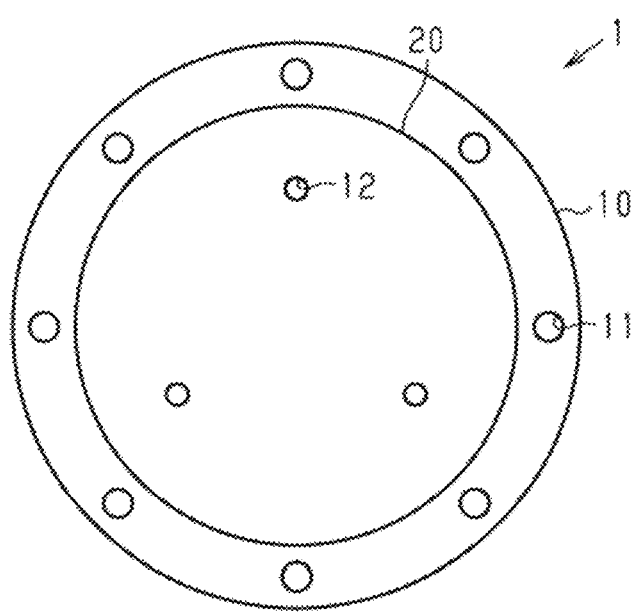
FIG. 2 is a schematic plan view of the electrostatic chuck.

As shown in FIG. 2, in the electrostatic chuck 1, the mounting table 20 is disposed on the disk-like base plater 10 so that a peripheral portion of the base plate 10 is exposed around the mounting table 20. In the peripheral portion of the base plate 10, attachment holes 11 for attaching the electrostatic chuck 1 to a chamber of a semiconductor manufacturing apparatus are arrayed along the peripheral portion. In addition, each of the mounting table 20 and the base plate 10 has a plurality of (three in FIG. 1) lift pin opening portions 12 in its central portion. Lift pins for moving the substrate W an up/down direction are inserted into the lift pin opening portions 12. When the substrate is lifted up from the mounting table by the lift pins, the substrate W can be automatically conveyed by a conveyance apparatus.

As shown in FIG. 1, the substrate W is mounted on the mounting table 20 in the electrostatic chuck 1 according to the present embodiment. A positive (+) voltage is applied to the first electrostatic electrode 22a and a negative (−) voltage is applied to the second electrostatic electrode 22b. Thus, positive (+) electric charges are accumulated in the first electrostatic electrode 22a, and negative (−) electric charges are accumulated in the second electrostatic electrode 22b. In accordance with this, negative (−) electric charges are induced in a portion Wa of the substrate W corresponding to the first electrostatic electrode 22a and positive (+) electric charges are induced in a portion Wb of the substrate W corresponding to the second electrostatic electrode 22b.

When the substrate W, the electrostatic electrode 22 and a ceramics portion 24 of the mounting table 20 (the substrate body 21) disposed between, the substrate W and the electrostatic electrode 22 are regarded as a capacitor, the ceramics portion 24 corresponds to a dielectric layer. The substrate W is electrostatically adsorbed on the mounting table 20 by Coulomb force generated between the electrostatic electrode 22 and the substrate W through the ceramics portion 24. A predetermined voltage is applied to the heating element 23 so that the mounting table 20 can be heated by the heating element 23. The substrate W is controlled at a predetermined temperature by the temperature of the mounting table 20. Heating temperature of the electrostatic chuck 1 is set in a range of from 50° C. to 200° C. for example, set at 150° C.

(Manufacturing Method)

Figure 3:
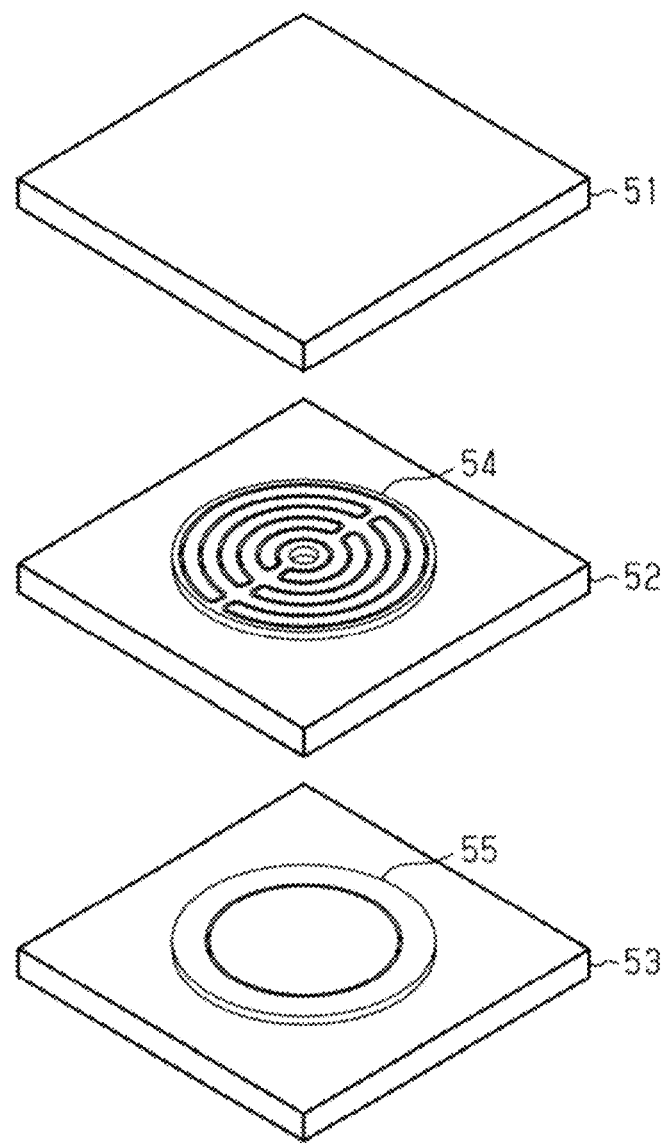
FIG. 3 is a perspective view showing a manufacturing process of the electrostatic chuck.

Next, a manufacturing method of the aforementioned mounting table 20 will be described. First, as shown in FIG. 3, green sheets 51 to 53 made of a ceramics material and an organic material are prepared. Each of the green sheets 51 to 53 is formed like a rectangular plate. Tire ceramics material of the green sheets 51 to 53 contains aluminum oxide and is free from any sintering agent.

In the green sheet 51, an organic component is removed, and the ceramics material is sintered to be densified. Thus, the resulting green sheet 51 serves as a portion of the substrate body 21 where the substrate W shown in FIG. 1 will be mounted. The green sheet 52 is fired to form a portion of the substrate body 21 between the electrostatic electrode 22 and the heating element 23 so that the electrostatic electrode 22 shown in FIG. 1 can be formed on the green sheet 52. The green sheet 53 is fired to form a portion of fire substrate body 21 which will be bonded to the base plate 10 so that the heating element 23 shown in FIG. 1 can be formed on the green sheet 53.

Next, an electric conductor pattern 54 is formed on an upper surface of the green sheet 52, for example, by a printing method (screen printing) using an electrically conductive paste. The electrically conductive paste contains tungsten as a main component, and further contains a mixture of nickel oxide, aluminum oxide, silicon dioxide, and an organic material. In a step which will be described later, the electric conductor pattern 54 is fired to form the electrostatic electrode 22 shown in FIG. 1. Incidentally, the electric conductor pattern 54 may be formed on a lower surface of the aforementioned green sheet 51.

The electrically conductive paste used for the formation of the electric conductor pattern 54 contains the tungsten as the main component, and further contains tire mixture of the nickel oxide, the aluminum oxide, the silicon dioxide and the organic material. An additive amount of the nickel oxide relative to the tungsten is preferably 0.2 wt % or more and 1.0 wt % or less. In order to improve sinterability of the tungsten, it is preferable that 0.2 wt % or more of the nickel oxide is added. On the other hand, when 5 wt % or more of the nickel oxide is added, crystal of the tungsten becomes too large to obtain sufficient adhesion between the electrostatic electrode 22 and the substrate body 21. Upon burning the electrically conductive paste and the green sheets at the same time, the average particle size of the tungsten may be 0.5 µm or more and 3.0 µm or less, while the average particle size of the nickel oxide may be 5.0 µm or more and 15.0 µm or less.

An additive amount of the aluminum oxide relative to the tungsten is preferably 0.2 wt % or more and 3.0 wt % or less. It is preferable that 0.2 wt % or more of the aluminum oxide is added in order to improve adhesiveness between the electrostatic electrode 22 and the substrate body 21 made of the ceramics containing the aluminum oxide. On the other hand, when more than 3.0 wt % of the aluminum oxide is added, sinterability is lowered. In addition, resistivity is increased. Upon burning the electrically conductive paste and the green sheets at the same time, the average particle size of the aluminum oxide may be 1.0 µm or more and 4.0 µm or less.

An additive amount of the silicon dioxide relative to the tungsten is preferably 0.2 wt % or more and 3.0 or less. The silicon dioxide changes to a liquid phase during firing. It is preferable that 0.2 wt % or more of the silicon dioxide is added in order to improve sinterability of the tungsten and the adhesiveness between the electrostatic, electrode 22 and the substrate body 21. On the other hand, when more than 3.0 wt % of the silicon dioxide is added, the sinterability and the adhesiveness are lowered. In addition, the resistivity is increased. Upon burning the electrically conductive paste and the green sheets at the same time, the average particle size of the silicon dioxide may be 1.0 µm or more and 12.0 µm or less.

Next, an electric conductor pattern 55 is formed on an upper surface of the green sheet, 53, for example, by a printing method (screen printing) using an electrically conductive paste. The electrically conductive paste for forming the electric conductor pattern 55 can use the same material as that of the electrically conductive paste for forming the aforementioned electric conductor pattern 54. In a step which will be described later, the electric conductor pattern 55 is fired to form the heating element 23. Incidentally, the electric conductor pattern 55 may be formed on a lower surface of the aforementioned green sheet 52.

Figure 4:
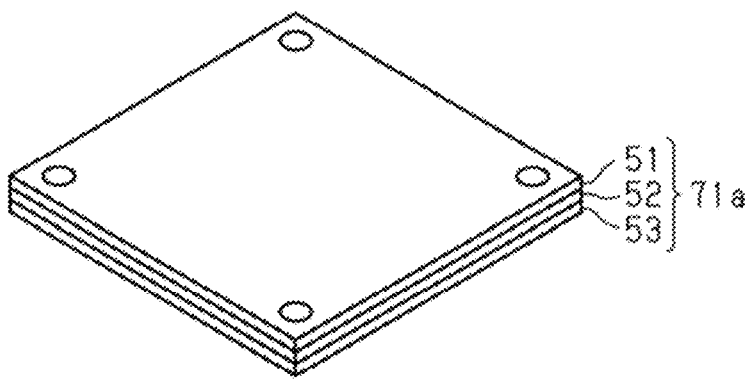
FIG. 4 is a perspective view showing the manufacturing process of the electrostatic chuck.

Next, the green sheets 51 to 53 are layered on one another so that a structure body 71a is formed, as shown in FIG. 4. The green sheets 51 to 53 are pressurized while heated so that the green sheets 51 to 53 are bonded to one another.

Figure 5:
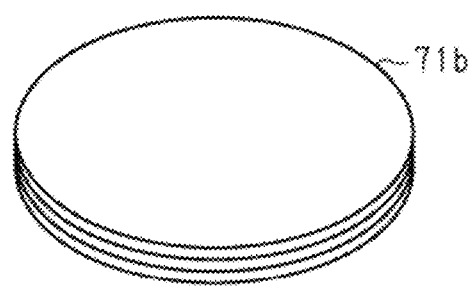
FIG. 5 is a perspective view showing the manufacturing process of the electrostatic chuck.
Figure 6:
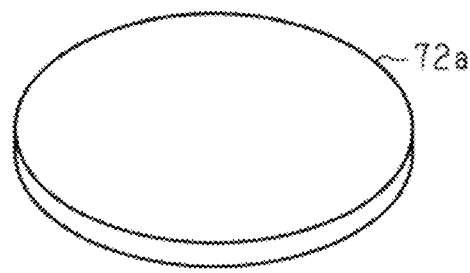
FIG. 6 is a perspective view showing the manufacturing process of the electrostatic chuck.

Next, the periphery of the structure body 71a is cut so that a disk-like structure body 71b is formed, as shown in FIG. 5. Next, the structure body 71b is fired so that a ceramics substrate 72a shown in FIG. 6 is obtained. Temperature during the firing is, for example, 1,600° C. The electrostatic electrode 22 and the heating element 23 (see FIG. 1) obtained by sintering the electric conductor patterns 54 and 55 shown in FIG. 3 and FIG. 4 are built in the ceramics substrate 72a. Such a ceramics substrate 72a is machined variously.

For example, of the ceramics substrate 72a, opposite upper and lower surfaces are polished so that a mounting surface and a bonding surface are formed. In addition, lift pin opening portions 12 shown in FIG. 1 are formed in the ceramics substrate 72a.

By the aforementioned process, the mounting table 20 is obtained.

(Effects)
(Manufacturing of Samples)

Figure 7A:
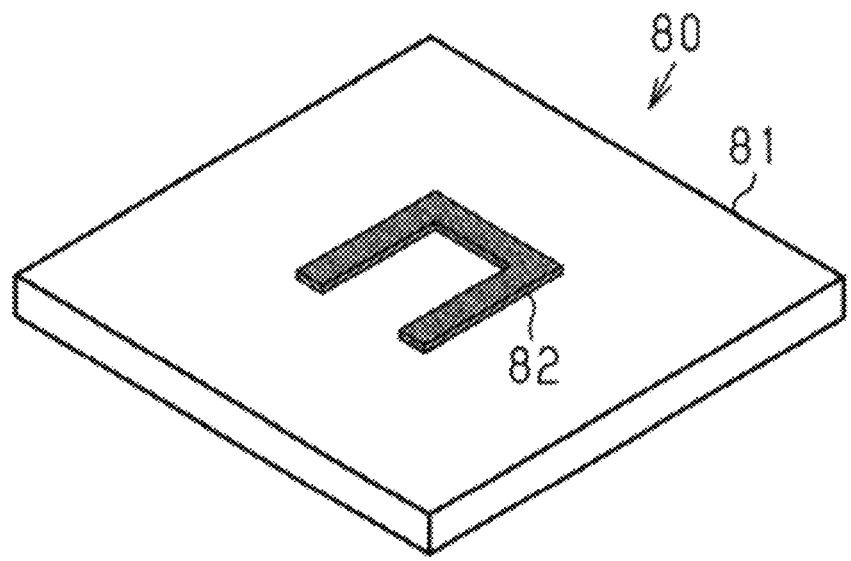
FIG. 7A is a perspective view showing a scratching test.

A sample 80 shown in FIG. 7A was manufactured. The sample 80 had a ceramics substrate 81, and an electric conductor pattern 82 provided on an upper surface of the ceramics substrate 81. The ceramics substrate 81 was made of ceramics containing aluminum oxide. In addition, the ceramics substrate 81 had a raw material composition free from an sintering agent. Purity of aluminum oxide in the ceramics substrate 81 was 99.5% or more. The electric conductor pattern 82 was formed from an electrically conductive paste which contained tungsten, or an electrically conductive paste in which tungsten was contained as a main component and additive amounts of nickel oxide, aluminum oxide and silicon dioxide had been adjusted. The electrically conductive paste was printed on a green sheet, and then tired integrally and simultaneously. As a result, the sample 80 was funned. In the sintered ceramics substrate 81, an average grain size of the aluminum oxide was in a range of 1.0 µm to 3.0 µm.

Figure 7B:
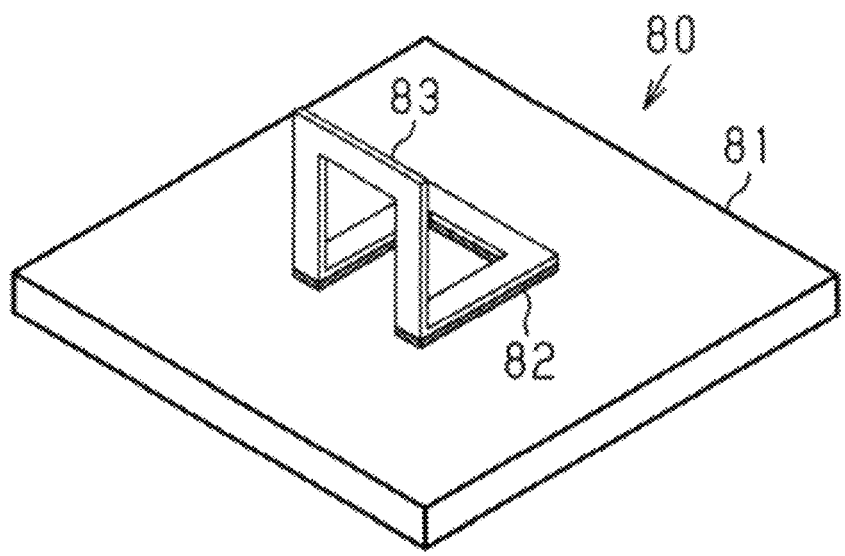
FIG. 7B is a perspective view showing a peeling test.

During a peeling test, a ring 83 made of kovar was heated and bonded to an upper surface of the electric conductor pattern 82 of the sample 80 through a silver solder containing copper, as, shown in FIG. 7B. A tension test apparatus fixed the ceramics substrate 81, pulled up one end of the ring 83, and recorded test force with which the electric conductor pattern 8.2 could be peeled off from the ceramics substrate 81.

FIG. 8 shows additive amounts [wt %] of nickel oxide (NiO), aluminum oxide ($Al_2O_3$) and silicon dioxide ($SiO_2$) added to the electrically conductive paste forming the electric conductor pattern 82 of each sample 80 manufactured by the present inventor, resistivity [Ωm] of the electric conductor pattern 82, and evaluation results of sinterability and adhesiveness of the electric conductor pattern 82. As for the electric conductor pattern 82 of the manufactured sample 80, the sinterability was evaluated by a scratching test (scratch test) and the adhesiveness was evaluated by a peeling test. Incidentally, in the following description, Sample No. 1 to Sample No. 20 will be described as samples 1 to 20.

The sample 1 included an electric conductor pattern 82 which was formed by use of an electrically conductive material that contained tungsten but was not added with (i.e. was free from addition of) any of nickel oxide, aluminum oxide and silicon dioxide. In the sample 1, resistivity of the electric conductor pattern 82 was $2.85 \times 10^{-7}$ [Ωm]. Incidentally, resistivity of the tungsten is $5.29 \times 10^{-8}$ [Ωm].

The sample 1 was obtained by printing the electrically conductive paste on a green sheet and firing the green sheet and the electrically conductive paste. The green sheet was made of aluminum oxide and free from any sintering agent. The electrically conductive paste was made of only the tungsten. In the sample 1, a liquid phase component was not contained in the green sheet and the electrically conductive paste. Accordingly, firing of the tungsten contained in the electrically conductive paste did not proceed so that strength of the electrically conductive pattern 82 could not be obtained. In addition, adhesion between the ceramics substrate 81 and the electrically conductive pattern 82 could not be obtained.

Each of the samples 2 to 20 included an electric conductor pattern which was formed by use of an electrically conductive paste. The electrically conductive paste contained tungsten as a main component and was added with nickel oxide, aluminum oxide and silicon dioxide. The samples 3 to 12 and the samples 14 to 20 were samples each of which included an electrically conductive pattern 82 using an electrically conductive paste with the aforementioned suitable composition (contents). Sinterability of the electric conductor pattern 82 and adhesiveness between the ceramics substrate 81 and the electrically conductive pattern 82 in each of the samples 3 to 12 and the samples 14 to 20 were evaluated as excellent.

As for the sample 2, the electrically conductive paste in which additive amounts of the nickel oxide, the aluminum oxide and the silicon dioxide were 0.1 wt % respectively was used. As for the sample 13, the electrically conductive paste in which an additive amount of the nickel oxide was 0.1 wt % and additive amounts of the aluminum oxide and the, silicon dioxide were 1 wt % respectively was used. Since the additive amount of the nickel oxide was small (0.1 wt %), sinterability of the tungsten was low to be evaluated as poor.

Incidentally, in each electric conductor pattern 82 whose sinterability was poor (for each of the samples 1, 2 and 13 evaluated as poor), a test piece for the peeling test could not be connected to the electric conductor pattern 82. Accordingly, evaluation of adhesiveness of the electric conductor pattern 82 by a tension test could not be performed.

Figure 9A:
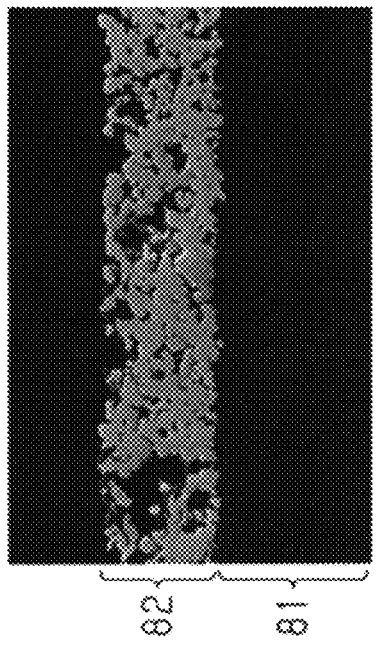
FIGS. 9A and 9B are section images showing ceramics and electrodes of a sample.

FIG. 9A shows an SEM image of a sample in which an electrically conductive paste was printed on a front surface of a green sheet, and fired integrally and simultaneously. The electrically conductive paste contained tungsten as a main component and was added with 0.5 wt % of nickel oxide, 2.0 wt % of aluminum oxide, and 2.0 wt % of silicon dioxide. The green sheet formed the aforementioned ceramics substrate 81. In FIG. 9A, an electric conductor pattern 82 is disposed in a central portion, and the ceramics substrate 81 is disposed on a lower side of the electric conductor pattern 82. In the sample, the electric conductor pattern 82 with excellent sinterability can be confirmed.

Figure 9B:
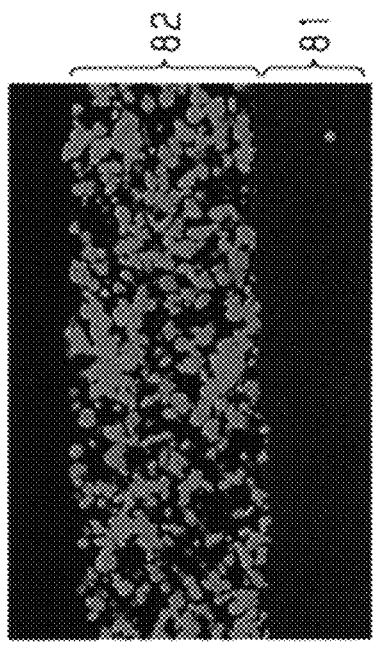

FIG. 9B shows an SEM image of a sample in which an electric conductor pattern 82 was formed by use of an additive-free electrically conductive material made of tungsten. In the sample, the electric conductor pattern 82 was low in sinterability, and was also low in strength.

Figure 10:
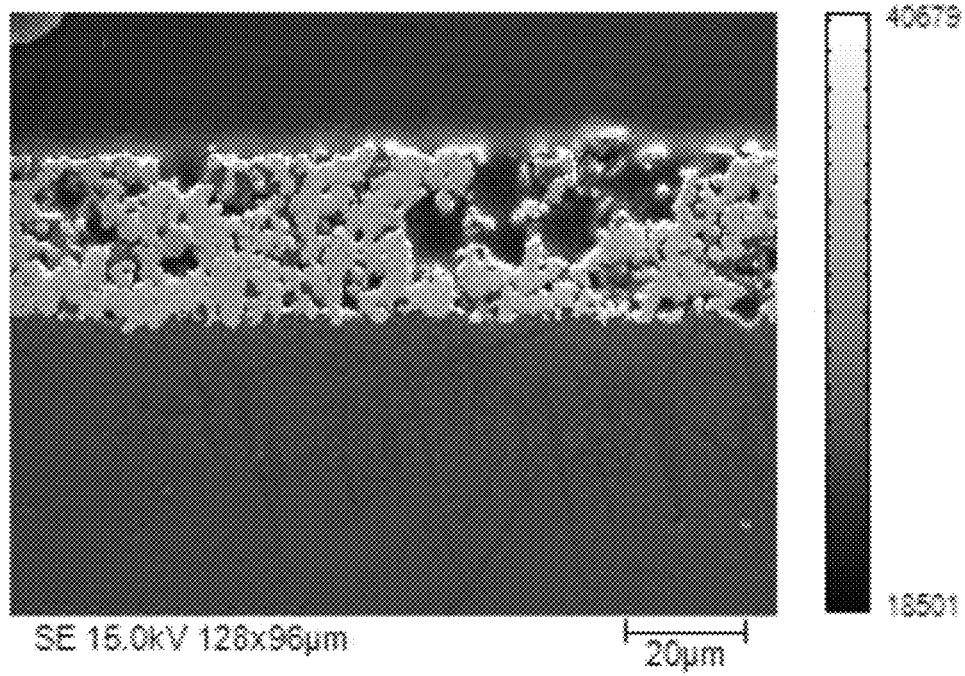
FIG. 10 is a secondary electron image of the analyzed sample.

The sample shown in FIG. 9A was analyzed by EPMA (Electron Probe MicroAnalyzer). FIG. 10 is a secondary electron image of the analyzed sample.

Figure 11:
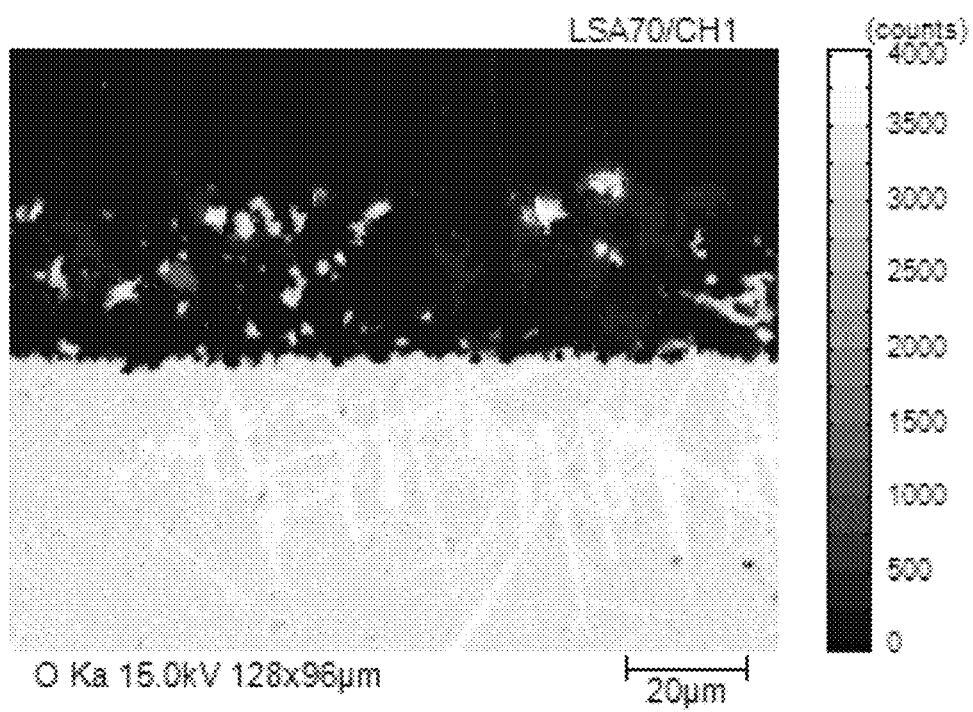
FIG. 11 is a section image showing an oxygen analysis result of the sample.
Figure 12:
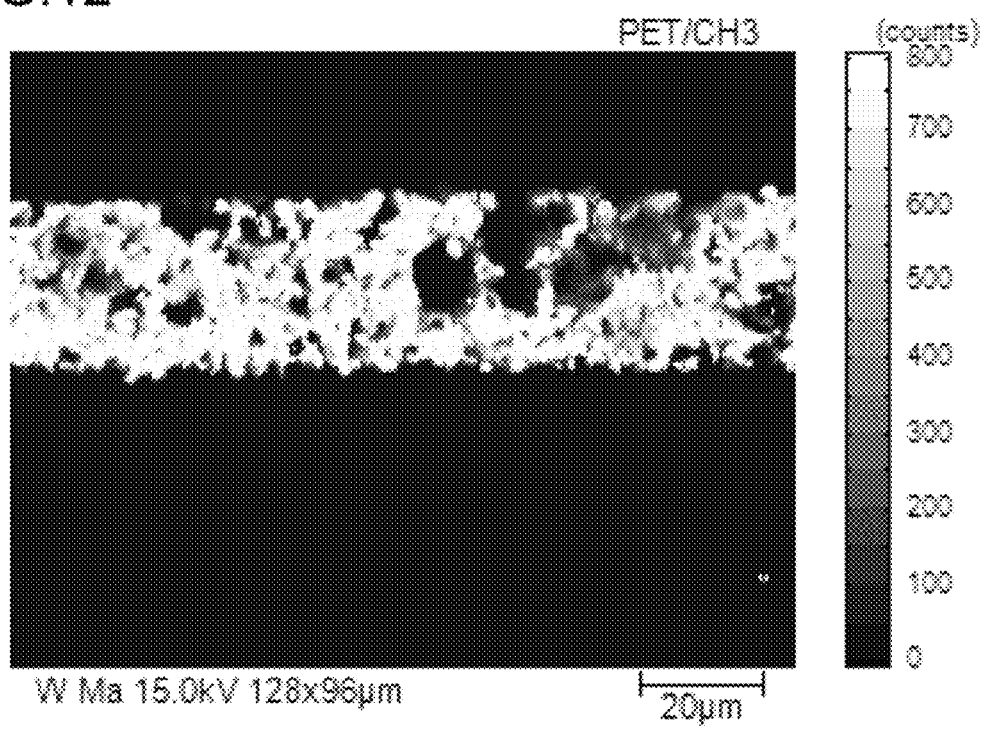
FIG. 12 is a section image showing a tungsten analysis result of the sample.

FIG. 11 is a section image showing an oxygen analysis result of the sample. The oxygen is present in both of the ceramics substrate 81 and the electrically conductor pattern 82. The oxygen is present at almost the same position as that of the aluminum or silicon (described later), and thus it is found that the aluminum and silicon are present as oxides even after being burned. FIG. 12 is a section image showing a tungsten analysis result of the sample. The tungsten is localized in the electrically conductor pattern 82, and not diffused to the ceramics substrate 81. In order to obtain a good sintering characteristic of the electrically conductor pattern 82 and a good electrical characteristic of the ceramics substrate 81, it is preferable that the tungsten is present in the electrically conductor pattern 82 only.

Figure 13:
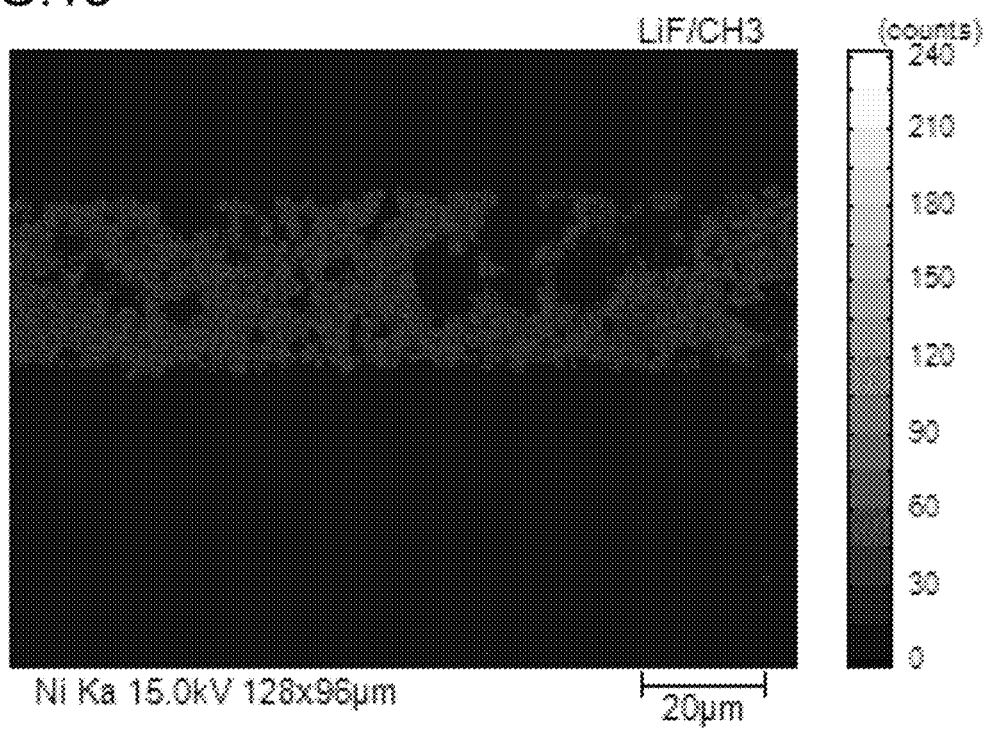
FIG. 13 is a section image showing a nickel analysis result of the sample.
Figure 14:
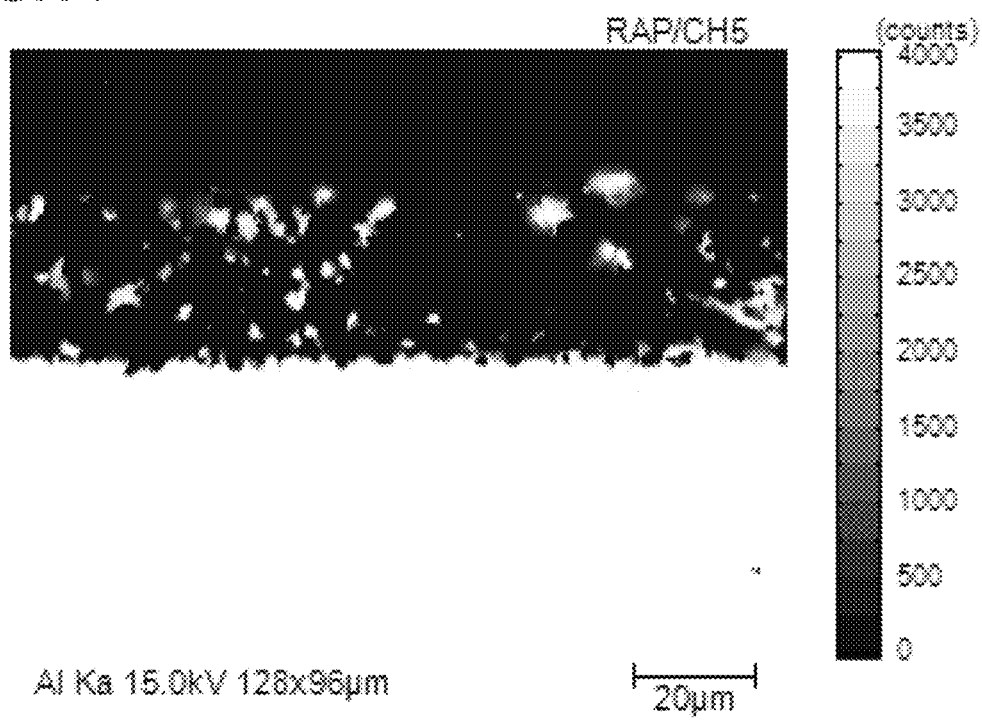
FIG. 14 is a section image showing an aluminum analysis result of the sample.

FIG. 13 is a section image showing a nickel analysis result of the sample. The nickel is localized in the electrically conductor pattern 82, and not diffused to the ceramics substrate 81. In order to obtain a good sintering characteristic of the electrically conductor pattern 82 and a good electrical characteristic of the ceramics substrate 81, it is preferable that the nickel is present in the electrically conductor pattern 82 only, FIG. 14 is a section image showing an aluminum analysis result of the sample. The aluminum is present M both of the electrically conductor pattern 82 and the ceramics substrate 81. It is considered that bonding strength between the electric conductor pattern 82 and the ceramics substrate 81 is improved.

Figure 15:
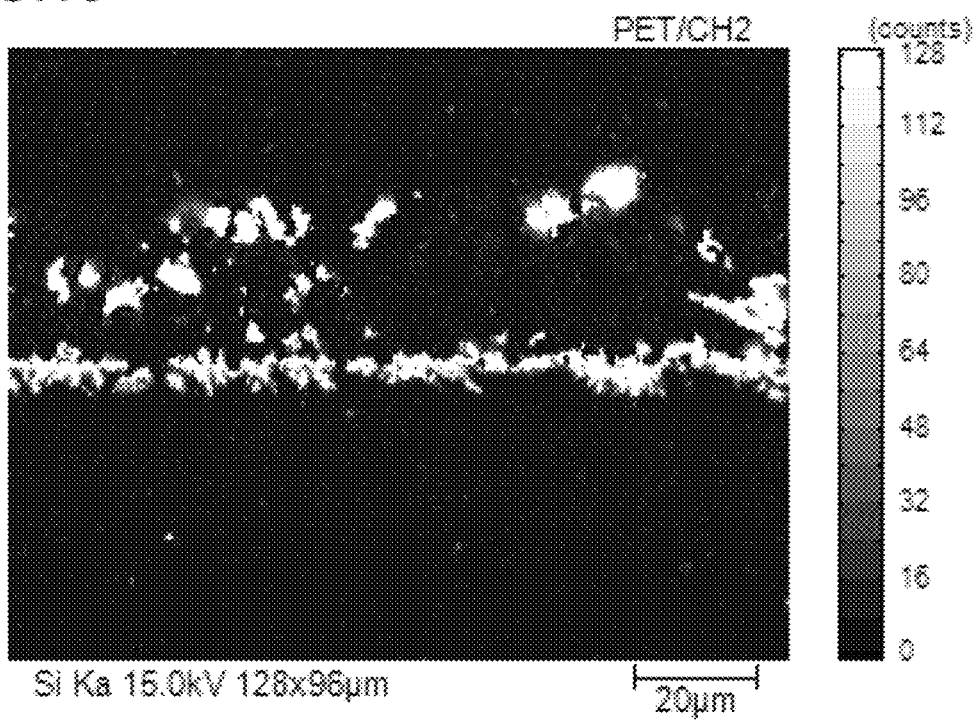
FIG. 15 is a section image showing a silicon analysis result of the sample.

FIG. 15 is a section image showing a silicon analysis result of the sample. The silicon is present in both of the electrically conductor pattern 82 and the ceramics substrate 81. In this regard, it was confirmed that the silicon in the ceramics substrate 81 was present only within a range of 10 μm from an interface between the electric conductor pattern 82 and the ceramics substrate 81 and absent beyond that range. Accordingly, it is considered that bonding strength between the electric conductor pattern 82 and the ceramics substrate 81 is improved without deteriorating the electrical characteristic of the ceramics substrate 81.

Meanwhile, it was confirmed that when magnesium oxide was used in place of the silicon dioxide, a distribution close to the aforementioned one was obtained but a diffusion amount of the magnesium toward the ceramics substrate 81 was large, and bonding strength between the electric, conductor pattern 82 and the ceramics substrate 81 was weaker than that in the case where the silicon oxide was used.

Figure 16:
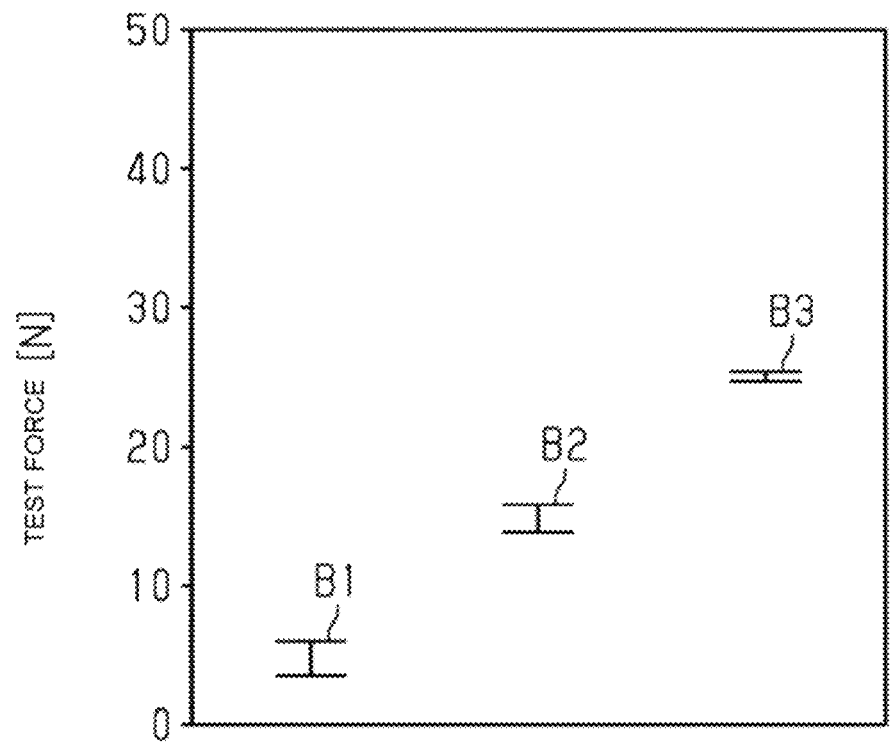
FIG. 16 is an explanatory view showing test results.

Bars B1, B2 and B3 shown in FIG. 16 show ranges of test forces [N] when adhesion strengths about electric conductor patterns of samples which will be described below were confirmed by the peeling, test. The bar B1 shows a test result of an electric conductor pattern formed by use of an additive-free electrically conductive paste. The bar 82 shows a test result of an electric conductor pattern formed by use of an electrically conductive paste added with 0.5 wt % of nickel oxide, 1.0 wt % of aluminum oxide, and 1.0 wt % of silicon dioxide. The bar 83 shows a test result of an electric conductor pattern formed by use of an electrically conductive paste added with 0.5 wt % of nickel oxide, 2.0 wt % of aluminum oxide, and 2.0 wt % of silicon dioxide. Since the aluminum oxide and the silicon dioxide are added, adhesion strength of the electric conductor pattern can be improved. Further, when contents of the aluminum oxide and the silicon dioxide are increased, the adhesion strength of the electric conductor pattern can be improved more greatly.

Figure 17:
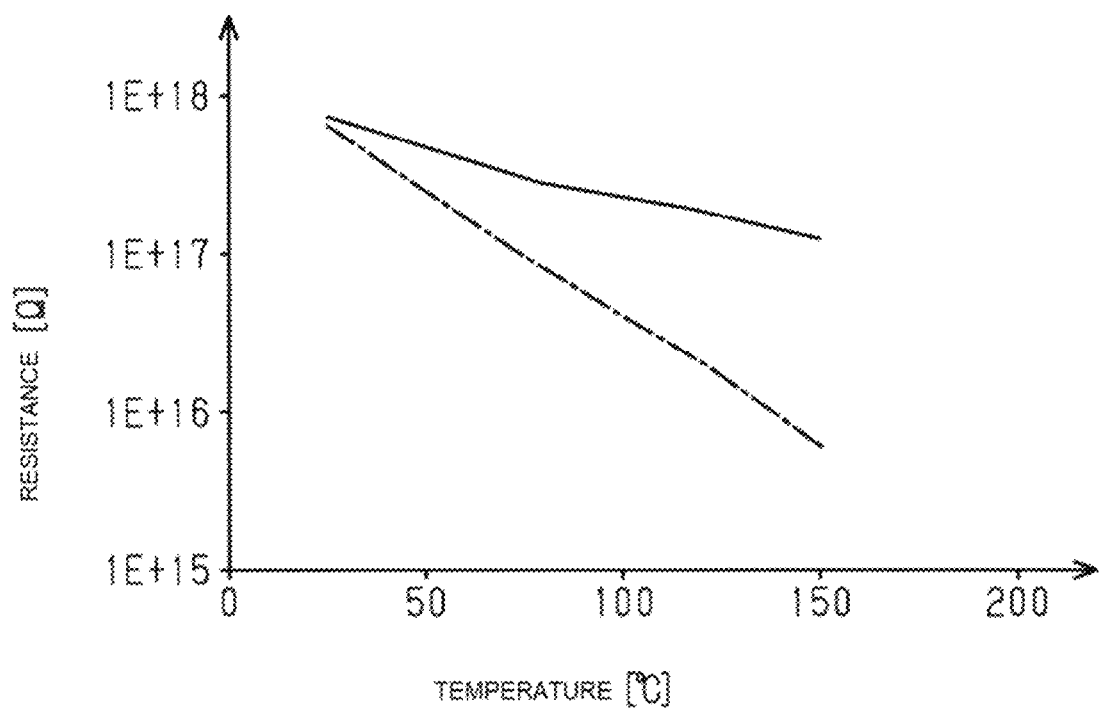
FIG. 17 is an explanatory view showing the relation between temperature and a resistance value of ceramics.

In FIG. 17, the solid line designates a relation between temperature and a resistance value of ceramics (hereinafter referred to as additive-free ceramics) in which a green sheet of aluminum oxide not containing any sintering agent was tired, and the one-dot chain line designates a relation between temperature and a resistance value of ceramics (hereinafter referred to as additive-containing ceramics) in which a green sheet having a composition containing a sintering agent was tired. The additive-free ceramics has a small change of the resistance value against a temperature change, but the additive-containing ceramics has a larger change of the resistance value against the temperature change than the additive-free ceramics. That is, the additive-free ceramics has low temperature dependency of insulation resistance. As a characteristic required of the ceramics used for an electrostatic chuck, it is desired that insulation resistance does not decrease so much even when temperature of a usage environment increases. The additive-free ceramics having such a characteristic is effective as a substrate body 21 including an electrostatic electrode 22.
(Other Comparative Examples)
Confirmation of Sinterability A sample was manufactured in such a manner that an electrically conductive paste containing 5 wt % of nickel oxide was printed on a sintering agent-free green sheet, and fired integrally and simultaneously. A section image of the sample based on SEM (Scanning Electron Microscope) and EDX (Energy Dispersive X-ray spectrometry) was acquired. In the section image, crystal of tungsten became too large in the electrode after the firing. The crystal of such tungsten was apt to be peeled off from a ceramics substrate.
Confirmation of Resistivity of Electric Conductor Pattern A sample was manufactured in such manner that an electrically conductive paste free front addition of nickel oxide, aluminum oxide and silicon dioxide was printed on a sintering agent-free green sheet, and fired integrally and simultaneously. In the sample, resistivity of an electric conductor pattern was $2.85 \times 10^{-7}$ [$\Omega$m].

A sample was manufactured in such a manner that an electrically conductive paste containing 1 wt % of nickel oxide, 3 wt % of aluminum oxide and 3 wt % of silicon dioxide was printed on a sintering agent-free green sheet, and fired integrally and simultaneously. In the sample, resistivity of an electric conductor pattern was $2.84 \times 10^{-7}$ [$\Omega$m], so that resistivity having the same level as that of the aforementioned sample could be obtained.

A sample was manufactured an such a manner that an electrically conductive paste containing 1 wt % of nickel oxide and 10 wt % of aluminum oxide but free from addition of silicon dioxide was printed on a sintering agent tree green sheet, and fired integrally and simultaneously in the sample, resistivity of an electric conductor pattern was $1.24 \times 10^{-6}$ [$\Omega$m], so that the resistivity increased.

According to the present embodiment, as described above, the following effects can be obtained.

(1) A mounting table 20 of an electrostatic chuck 1 includes a substrate body 21, and an electrostatic electrode 22 provided in the substrate body 21. The substrate body 21 is made of ceramics containing aluminum oxide ($Al_2O_3$). The electrostatic electrode 22 is a sintered body containing tungsten (W) as a main component and further containing nickel oxide (NiO), aluminum oxide ($Al_2O_3$), and silicon dioxide ($SiO_2$). When the electrostatic electrode 22 is formed to have such a configuration, the mounting table 20 including the electrostatic electrode 22 can be obtained without lowering any characteristic of the ceramics of the substrate body 21.

(2) Sinterability of the tungsten is improved due to the nickel oxide. Adhesiveness between the ceramics and the tungsten is improved due to the aluminum oxide and the silicon dioxide. Accordingly, it is unnecessary to use any sintering agent. Hence, the mounting table 20 including the electrostatic electrode 22 can be obtained without lowering any characteristic of the ceramics.

(3) The ceramics of the substrate body 21 has a purity of 99.5% or more. Such a substrate body 21 has low temperature dependency of insulation resistance and can suppress the insulation resistance from being lowered against an increase of the temperature.

(4) The ceramics of the substrate body 21 has a relative density of 98% or more. Such a substrate body 21 has a small number of pores in its front surface and inside. The pores affect adsorption of the substrate body 21. Accordingly, the substrate body 21 high in relative density is characteristically preferred as the electrostatic chuck 1.

Second Embodiment

Figure 18:
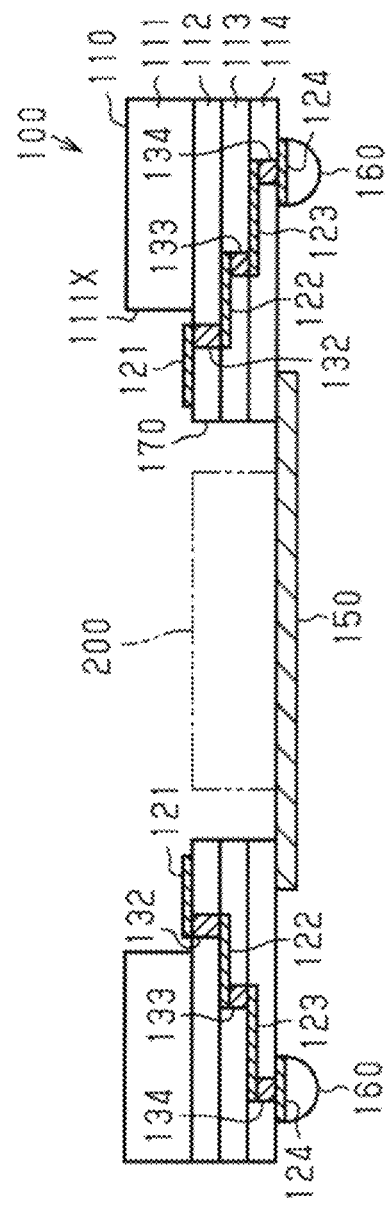
FIG. 18 is a schematic sectional view of a semiconductor device package according to a second embodiment.

FIG. 18 is a schematic sectional view of a semiconductor device package according to a second embodiment. FIG. 13 shows a schematic plane of the semiconductor device package.

As shown in FIG. 18, the semiconductor device package 100 has a ceramics substrate 110, a heat sink 150, and external connection terminals 160. The heat sink 150 is brazed to the ceramics substrate 110.

The ceramics substrate 110 has a plurality of (four in the present embodiment) layered ceramics base materials 111, 112, 113 and 114, wiring patterns 121, 122, 123 and 124 made of tungsten, and vias 132, 133 and 134 penetrating the ceramics base materials 112, 113 and 114. The vias 132 connect the wiring patterns 121 and 122 to each other. The vias 133 connect the wiring patterns 122 and 123 to each other. The vias 134 connect the wiring patterns 123 and 124 to each other. The ceramics substrate 110 has a substrate body constituted by the ceramics base materials 111 to 114, and the wiring patterns 121 to 124 made of the tungsten.

Figure 19:
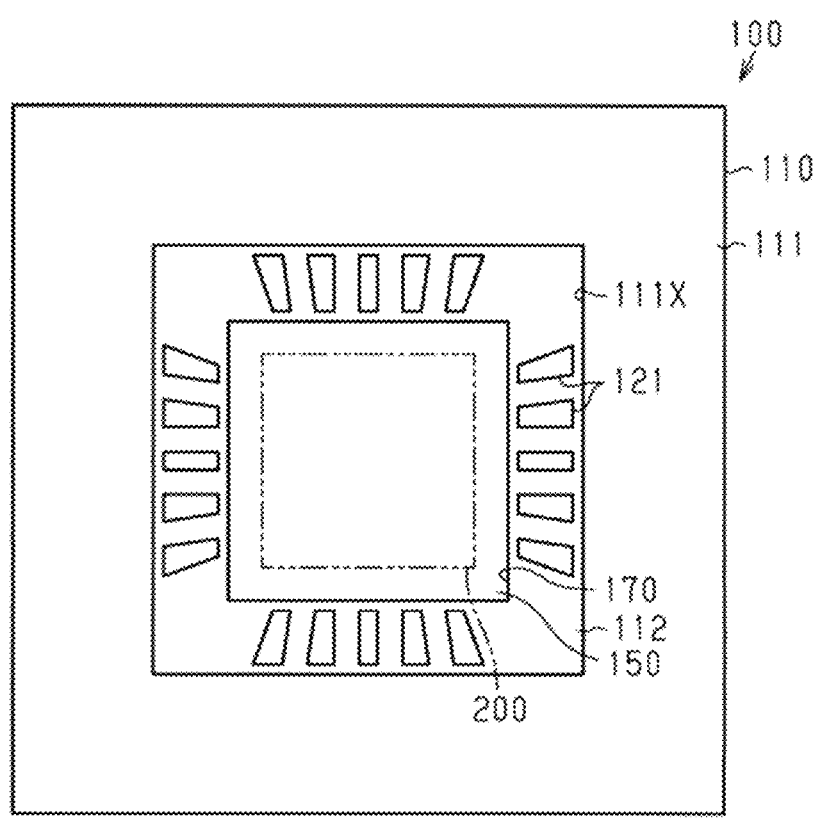
FIG. 19 is a schematic plan view of the semiconductor device package.

As shown in FIG. 18 and FIG. 19, a cavity 170 is provided in the ceramics substrate 110 to penetrate central portions of the ceramics base materials 112, 113 and 114 so that a semiconductor element 200 can be mounted in the cavity 70. The wiring pattern 121 disposed on an upper surface of the ceramics base material 112 so as to surround the cavity 170. An opening portion 111X exposing the wiring patterns 121 is formed in the ceramics base material 111.

The ceramics base materials 111 to 114 are made of ceramics containing aluminum oxide. The wiring patterns 121 to 124 and the vias 132 to 134 are a sintered body, which contains tungsten as a main component and further contains nickel oxide, aluminum oxide and silicon dioxide. The ceramics substrate 110 can be manufactured by a manufacturing method similar to or the same as that of the mounting table 20 in the first embodiment.

In the semiconductor device package 100, the semiconductor element 200 is mounted on the heat sink 150. Pads of the semiconductor element 200 are electrically connected to the wiring patterns 121 of the ceramics substrate 110 by bonding wires etc. Thus, the semiconductor element 200 is connected to the external connection terminals 160 through the wiring patterns 121 to 124 and the vias 132 and 134.

In such a semiconductor device package 100, the ceramics substrate 110 including the wiring patterns 121 to 124 can be obtained without lowering characteristics of the ceramics base materials 111 to 114 forming the substrate body, in a similar manner or the same manner as in the first embodiment. In the ceramics substrate 110, adhesiveness between the ceramics base materials 111 to 114 and the wiring patterns 121 to 124 in the ceramics substrate 110 can be improved.

Other Embodiments

Incidentally, the aforementioned embodiment may be carried out in any of the following embodiments. Any member or members included in the electrostatic chuck or arrangement thereof in the aforementioned first embodiment may be changed suitably.

The heat sink 23 in the aforementioned first embodiment may be disposed between the mounting table 20 and the base plate 10. In addition, the beat sink 23 may be provided internally in the base plate 10. In addition, the heat sink 23 may be externally attached to a lower side of the electrostatic chuck.

The electrostatic chuck according to any of the first embodiment and the modifications can be applied to a semiconductor manufacturing apparatus, e.g. a dry etching apparatus (e.g. a parallel plate type reactive ion etching (RIE) apparatus).

Various aspects of the subject matter described herein are set out non-exhaustively in the following numbered clauses:

1) A method of manufacturing an electrostatic chuck comprising a substrate body and an electrostatic electrode provided in the substrate body, the method comprising:

preparing a sintering agent-free green sheet that is made of aluminum oxide and an organic material;

patterning an electrically conductive paste on the green sheet to thereby form an electric conductor pattern on the green sheet, wherein the electrically conductive paste contains tungsten as a main component and further contains nickel oxide, aluminum oxide and silicon dioxide; and firing the green sheet and the electric conductor pattern to thereby form the substrate body and the electrostatic electrode.

2) The method according to clause (1), wherein an additive amount of the oxide nickel relative to the tungsten is in a range of 0.2 wt % to 1.0 wt %.

3) The method according to clause (1), wherein an additive amount of the aluminum oxide relative to the tungsten is in a range of 0.2 wt % to 3.0 wt % and an additive amount of the silicon dioxide to the tungsten is in a range of 0.2 wt % to 3.0 wt %.

Although the preferred embodiments etc. have been described in detail, the concept of the disclosure is not limited to the above-described embodiments etc. and various modifications and replacements can be made in the above-described embodiments etc. without departing from the scope of the claims.

What is claimed is:

1. A ceramics substrate comprising:
a substrate body; and
an electric conductor pattern that is provided in the substrate body,
wherein
the substrate body is made of ceramics containing aluminum oxide, and
the electric conductor pattern is a sintered body that contains tungsten as a main component and further contains nickel oxide, aluminum oxide and silicon dioxide.

2. The ceramics substrate according to claim 1, wherein nickel is localized in the electrical conductor pattern.

3. The ceramics substrate according to claim 1, wherein the ceramics substrate is used for a semiconductor device package.

4. An electrostatic chuck comprising:
a substrate body; and
an electrostatic electrode that is provided in the substrate both;
wherein
the substrate body is made of ceramics containing aluminum oxide, and
the electrostatic electrode is a sintered body that contains tungsten as a main component and further includes nickel oxide, aluminum oxide, and silicon dioxide.

5. The electrostatic chuck according to claim 4, wherein nickel is localized in the electrostatic electrode.

6. The electrostatic chuck according to claim 4, wherein
the electrostatic electrode is a sintered body of an electrically conductive paste that contains tungsten as a main component and further contains nickel oxide, aluminum oxide and silicon dioxide, and
in the electrically conductive paste, an additive amount the nickel oxide relative to the tungsten is in a range of 0.2 wt % to 1.0 wt %.

7. The electrostatic chuck according to claim 4, wherein
the electrostatic electrode is a sintered body of an electrically conductive paste that contains tungsten as a main component and further contains nickel oxide, aluminum oxide and silicon dioxide, and
in the electrically conductive paste, an additive amount of the aluminum oxide relative to the tungsten is in a range of 0.2 wt % to 3.0 wt %, and an additive amount of the silicon dioxide relative to the tungsten is in a range of 0.2 wt % to 3.0 wt %.

8. The electrostatic chuck according to claim 4, wherein a purity of the aluminum oxide contained in the ceramics is 99.5% or more.

9. The electrostatic chuck according to claim 4, wherein a relative density of the substrate body to ceramics containing only aluminum oxide is 98% or more.

10. The electrostatic chuck according to claim 4, wherein an average grain size of the aluminum oxide contained in the ceramics is in a range of from 1.0 μm to 3.0 μm.

* * * * *